United States Patent
Xiong et al.

(10) Patent No.: US 11,184,024 B2
(45) Date of Patent: Nov. 23, 2021

(54) ERROR MITIGATION SCHEME FOR BIT-FLIPPING DECODERS FOR IRREGULAR LOW-DENSITY PARITY-CHECK CODES

(71) Applicant: SK hynix Inc., Icheon-si (KR)

(72) Inventors: Chenrong Xiong, San Jose, CA (US); Fan Zhang, Fremont, CA (US); Haobo Wang, San Jose, CA (US); Xuanxuan Lu, San Jose, CA (US); Meysam Asadi, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 21 days.

(21) Appl. No.: 16/700,963

(22) Filed: Dec. 2, 2019

(65) Prior Publication Data

US 2021/0167796 A1   Jun. 3, 2021

(51) Int. Cl.
*H03M 13/00*   (2006.01)
*H03M 13/11*   (2006.01)
*G06F 11/10*   (2006.01)

(52) U.S. Cl.
CPC ..... *H03M 13/1108* (2013.01); *G06F 11/1068* (2013.01)

(58) Field of Classification Search
CPC ........... H03M 13/1108; H03M 13/116; H03M 13/2948; G06F 11/1068; H04L 1/005
See application file for complete search history.

(56) References Cited

U.S. PATENT DOCUMENTS

| | | | | |
|---|---|---|---|---|
| 7,028,247 B2 * | 4/2006 | Lee | .......................... | G06F 7/724 714/784 |
| 8,055,977 B2 * | 11/2011 | Ito | ...................... | G11B 20/1803 714/758 |
| 8,601,328 B1 * | 12/2013 | Varnica | ............. | H03M 13/3707 714/714 |
| 9,270,297 B2 * | 2/2016 | Sharon | ............... | H03M 13/1117 |
| 9,323,611 B2 * | 4/2016 | Chilappagari | ...... | G06F 11/1068 |

(Continued)

OTHER PUBLICATIONS

F. Guo H. Henzo "Reliability ratio based weighted bit-flipping decoding for low-density paritycheck codes" IEEE Electron. Lett. vol. 40 No. 21 pp. 1356-1358 2004.

(Continued)

*Primary Examiner* — Esaw T Abraham
(74) *Attorney, Agent, or Firm* — Perkins Coie LLP

(57) ABSTRACT

Disclosed are devices, systems and methods for improving a bit-flipping algorithm for an irregular LDPC code in a non-volatile memory device. An example method includes receiving a noisy codeword, the codeword having been generated from an irregular low-density parity-check code, performing a first iteration of a bit-flipping algorithm on the noisy codeword, computing a first syndrome based on an output codeword of the first iteration, determining that the first syndrome comprises a non-zero vector and no bits of the noisy codeword were flipped during the first iteration of the bit-flipping algorithm, flipping, based on the determining, at least one bit of the output codeword, the at least one bit corresponding to a variable node of the plurality of variable nodes with a smallest column weight connected to one or more unsatisfied check nodes of the plurality of check nodes, and computing, subsequent to the flipping, a second syndrome.

20 Claims, 9 Drawing Sheets

(56) References Cited

U.S. PATENT DOCUMENTS

| | | | |
|---|---|---|---|
| 9,385,753 B2* | 7/2016 | Varnica | H03M 13/1108 |
| 9,811,418 B2* | 11/2017 | Sharon | G06F 3/0679 |
| 9,813,080 B1* | 11/2017 | Micheloni | H03M 13/114 |
| 10,084,479 B2* | 9/2018 | Hanham | H03M 13/1108 |
| 10,135,464 B2 | 11/2018 | Wang et al. | |
| 10,148,287 B2 | 12/2018 | Xiong et al. | |
| 10,177,787 B1 | 1/2019 | Danjean et al. | |
| 10,200,064 B1 | 2/2019 | Varnica et al. | |
| 10,230,396 B1* | 3/2019 | Micheloni | H03M 13/6583 |
| 10,523,236 B2* | 12/2019 | Kuo | H03M 13/1128 |

OTHER PUBLICATIONS

T. Wadayama, K. Nakamura, M. Yagita, Y. Funahashi, S. Usami and I. Takumi, "Gradient descent bit flipping algorithms for decoding LDPC codes," in IEEE Transactions on Communications, vol. 58, No. 6, pp. 1610-1614, Jun. 2010.

X. Wu, C. Zhao and X. You, "Parallel Weighted Bit-Flipping Decoding," in IEEE Communications Letters, vol. 11, No. 8, pp. 671-673, Aug. 2007.

\* cited by examiner

ERROR MITIGATION SCHEME FOR BIT-FLIPPING DECODERS FOR IRREGULAR LOW-DENSITY PARITY-CHECK CODES

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, multi-level NAND flash devices can be inherently unreliable and generally need to use ECCs to allow dramatic increase in data reliability at the expense of extra storage space for ECC parity bits. There is a demand for ECCs that can provide data protection with improved decoding performance.

SUMMARY

Embodiments of the disclosed technology relate to methods, devices and systems for an error mitigation scheme for bit-flipping decoders for irregular low-density parity-check (LDPC) codes. The methods and devices described in the present document advantageously, among other features and benefits, improve the decoding performance of irregular LDPC codes.

In an example aspect, a method for improving decoding operations of an error correction device includes receiving a noisy codeword, the codeword having been generated from an irregular low-density parity-check (LDPC) code, performing a first iteration of a bit-flipping algorithm on the noisy codeword, the bit-flipping algorithm comprising passing a message between a plurality of variable nodes and a plurality of check nodes, computing a first syndrome based on an output codeword of the first iteration, determining that (a) the first syndrome comprises a non-zero vector and (b) no bits of the noisy codeword were flipped during the first iteration of the bit-flipping algorithm, flipping, based on the determining, at least one bit of the output codeword, the at least one bit corresponding to a variable node of the plurality of variable nodes with a smallest column weight connected to one or more unsatisfied check nodes of the plurality of check nodes, and computing, subsequent to the flipping, a second syndrome.

In another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Low-density parity-check (LDPC) codes are an important part of linear block error-correcting codes (ECCs), which have found widespread use in data storage systems. LDPC codes are extremely powerful codes, with the sparse structure of their check matrix leading to excellent distance properties and enabling iterative decoding with a complexity that grows only linearly with the block length.

An LDPC code can be characterized by an M×N parity-check matrix H, the column weight of the i-th ($0 \leq i < N$) column of H is the number of non-zero entries in the i-th column of the parity-check matrix H. If column weights of all columns of H are the same, the LDPC code represented by H is called a regular LDPC code. Otherwise, the LDPC code is called an irregular LDPC code. In other words, columns of the parity-check matrix H of an irregular LDPC code have different column weights.

Irregular LDPC codes are characterized by a very sparse parity-check matrix H in which the column weight may vary from column to column and the row weight may vary from row to row. The ability to allocate the column and row weights flexibly provides a useful design freedom. In fact, properly designed irregular LDPC codes tend to outperform regular LDPC codes for large block lengths; gains of up to 0.5 dB can be obtained.

Due to their flexibility and improved decoding performance, irregular LDPC codes are increasingly being used in a non-volatile memory system (e.g., a NAND flash memory) to ensure robust data storage and access. FIGS. 1-6 overview a non-volatile memory system in which embodiments of the disclosed technology may be implemented.

Figure 1:
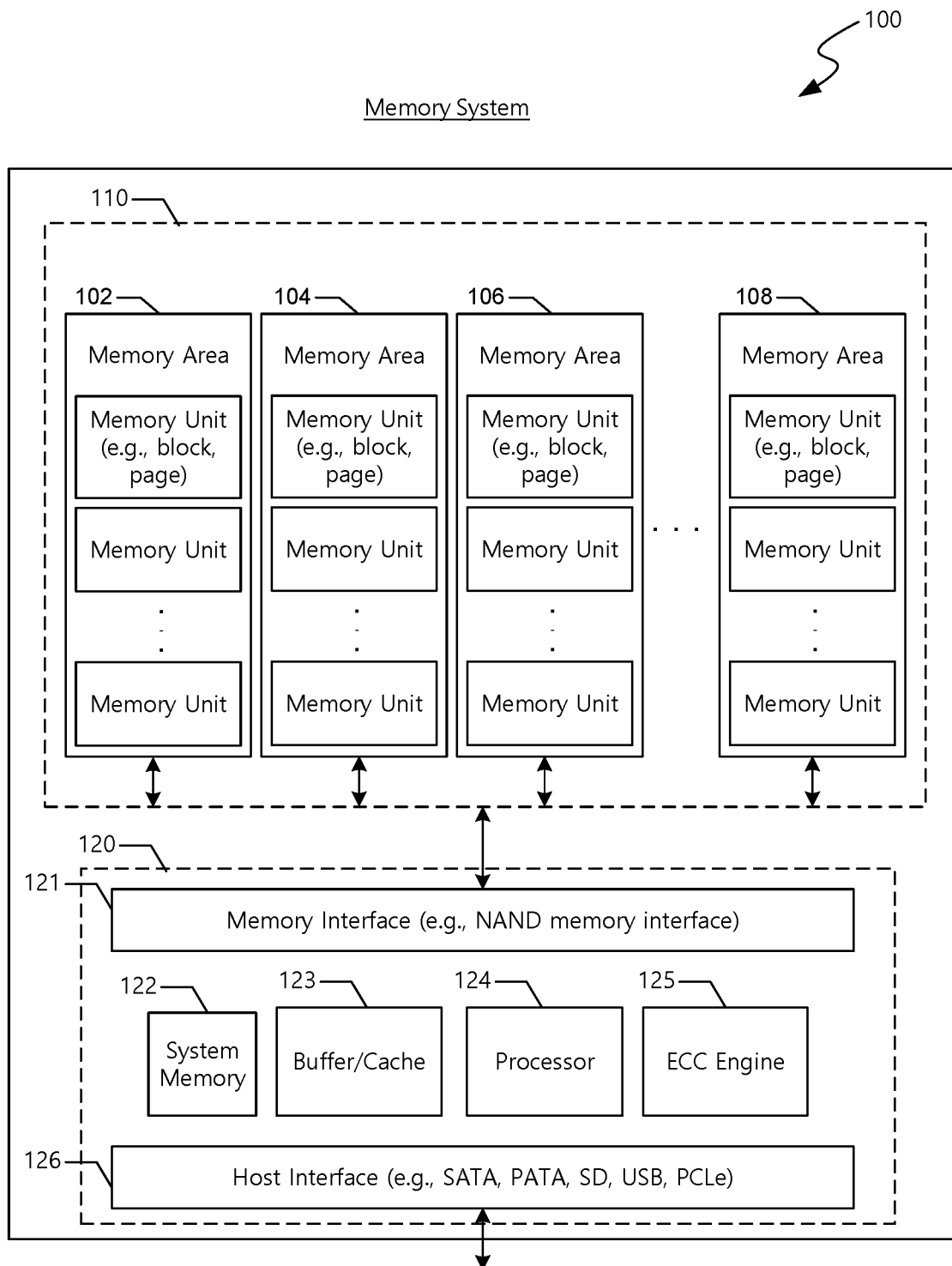
FIG. 1 illustrates an example of a memory system.

FIG. 1 is a block diagram of an example of a memory system 100 that can be implemented in some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
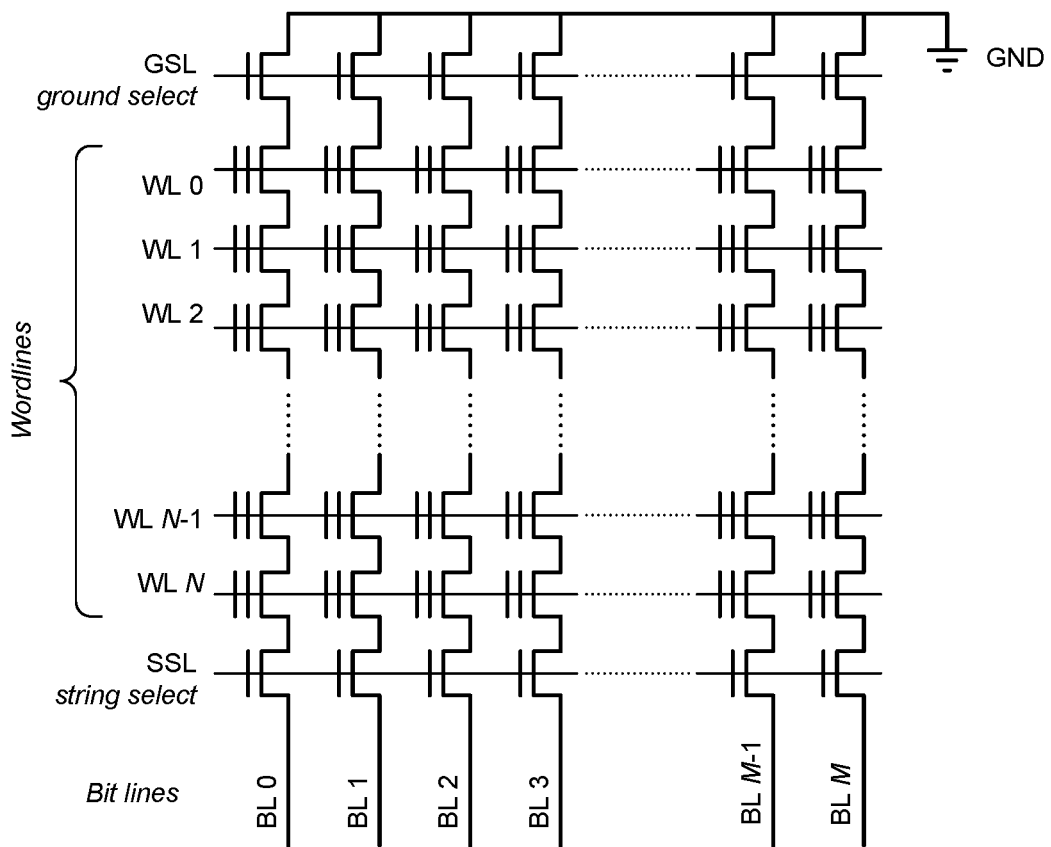
FIG. 2 is an illustration of an example non-volatile memory device.

FIG. 2 illustrates an example of a memory cell array implemented can be used in some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
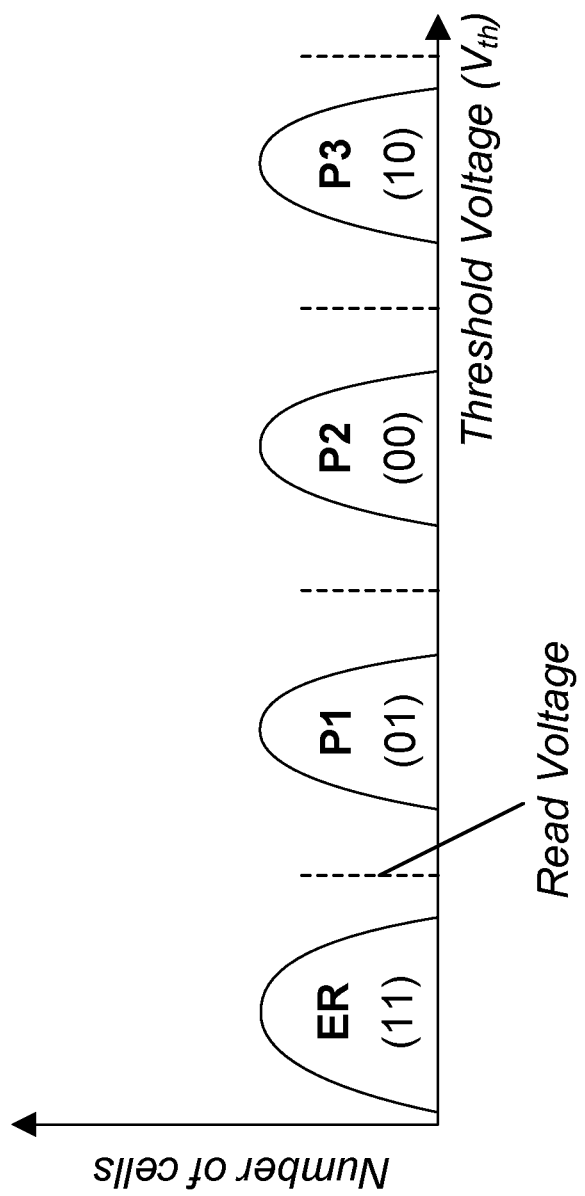
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
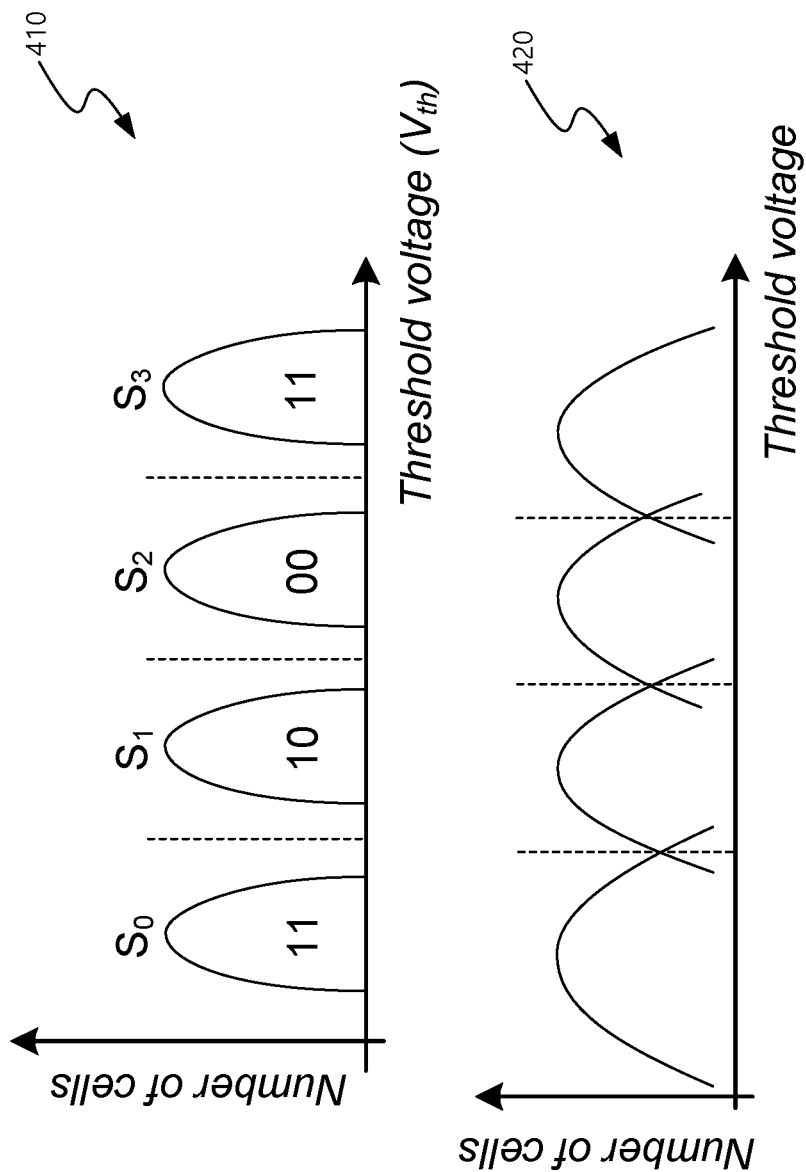
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
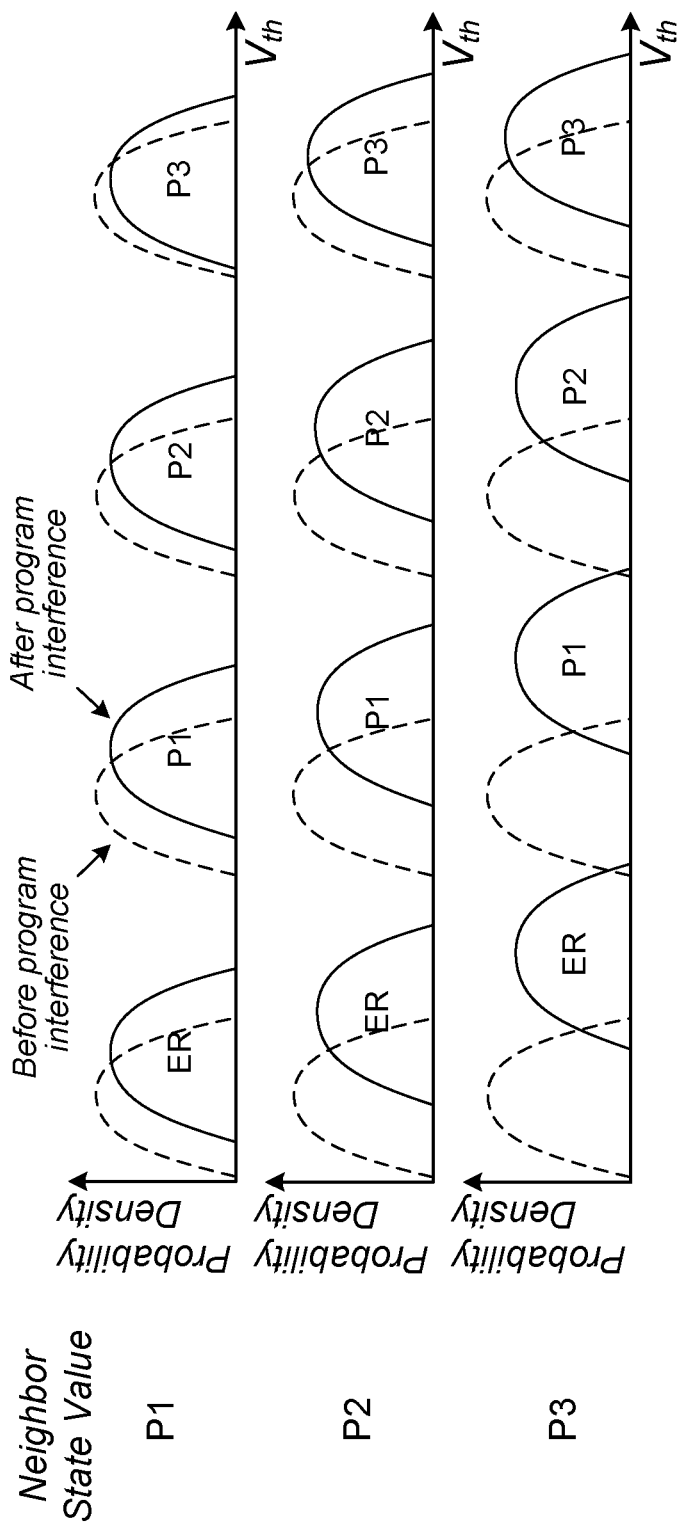
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
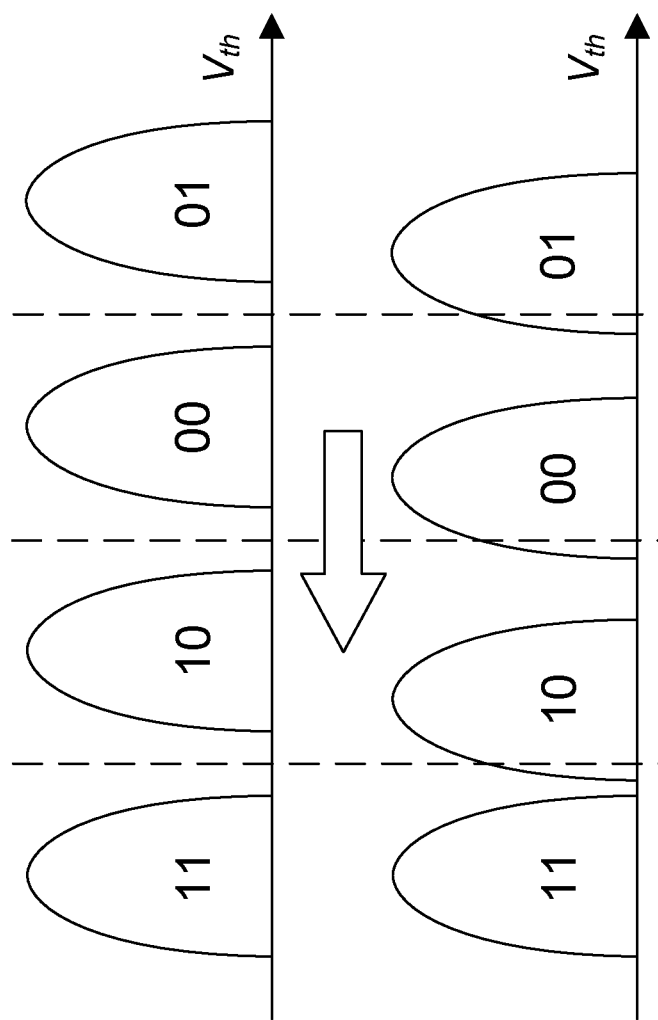
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In some embodiments, the decoding of irregular LDPC codes, implemented on the NAND flash memory described in FIGS. 1-6, is performed using iterative decoding methods known for LDPC codes such as bit-flipping decoding, sum-product algorithm based decoding or min-sum algorithm based decoding.

Both regular and irregular LDPC codes can be represented using a Tanner graph, which includes a set of nodes (or vertices) and a set of edges connecting the nodes. The Tanner graph corresponding to an M×N parity-check matrix contains M variable nodes (or bit nodes) and N check nodes (or check sum nodes), and provides a graphical representation of the parity-check matrix to which is corresponds. The performance and decoding of an LDPC code (regular or irregular) is based on the row-weights and column-weights of the parity-check matrix, or equivalently, the cycles in the Tanner graph representation.

As described earlier, irregular LDPC codes have varying column weights and row weights. However, the small column-weight variable nodes are vulnerable to errors and converge slowly during iterative decoding of these codes. That means that when a received codeword cannot be decoded, variable nodes with a small column weight (e.g., 2 or 3) usually have a higher probability of not being corrected than those with a larger column weight (e.g., 4, 5 or 6).

Embodiments of the disclosed technology include an error mitigation scheme (EMS) that advantageously improves the decoding performance of bit-flipping decoding algorithms for irregular LDPC codes. The described embodiments can be applied to any kind of bit-flipping algorithms for LDPC codes, such as weighted bit-flipping, gradient descent bit-flipping, parallel weighted bit-flipping and another variants.

The embodiments described herein assume that an irregular LDPC codeword c is transmitted as the modulated codeword x over an additive white Gaussian noise (AWGN) channel. The received signal is y=x+n, where n is the Gaussian noise. The receiver then estimates the bit sequence $\tilde{c}$ by calculating the syndrome based on the received signal y. If the syndrome is zero, then the estimated bit sequence $\tilde{c}$ is identical to the transmitted codeword c.

Figure 7:
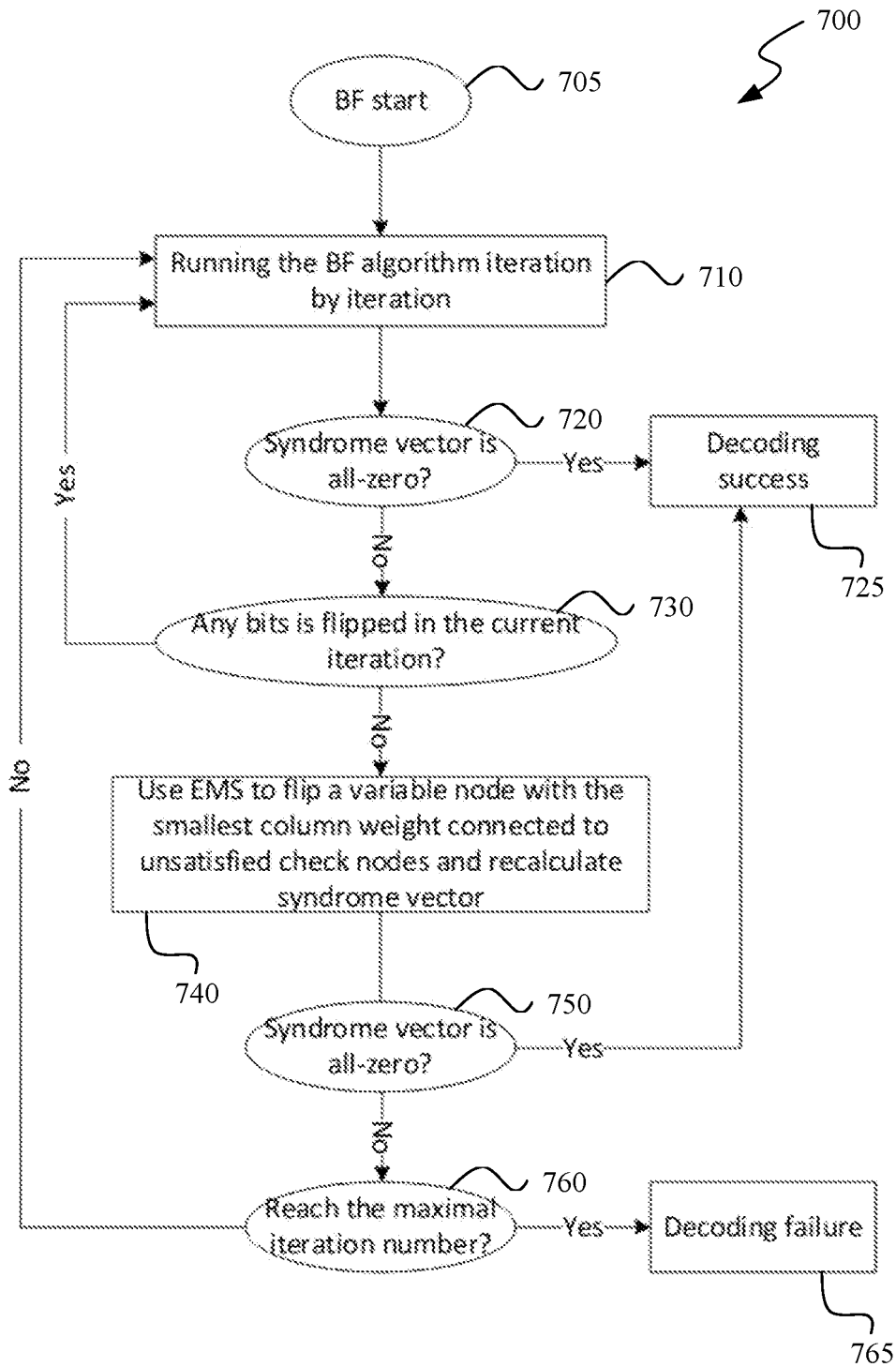
FIG. 7 illustrates an example of an error mitigation scheme (EMS) decoding flow implemented in a bit-flipping (BF) decoder.

FIG. 7 illustrates an example bit-flipping decoding flow. As illustrated therein, the bit-flipping decoding flow begins (operation 705) by running the bit-flipping algorithm iteration by iteration (operation 710). At the end of each iteration, the decoding flow checks whether the syndrome vector is the all-zero vector (operation 720). If the syndrome is zero, then the estimated bit sequence (e.g., $\tilde{c}$) is identical to the transmitted code (e.g., c), and the decoding operation is a success (operation 725). If the syndrome is non-zero, then the decoding flow checks whether any bits were flipped in the current iteration (operation 730).

If no bits were flipped during the current iteration and the syndrome is non-zero, this may be an indication of the bit-flipping algorithm being stuck in a local minimum (as compared to a global minimum, which would correspond to a decoding success). In other words, the bit-flipping algorithm has stalled because running another iteration would not change the decoded codeword (since no bits were flipped during the current iteration). The error mitigation scheme described in this document may be used to restart the decoding algorithm, thereby dislodging the bit-flipping algorithm from the local minimum.

In some embodiments, the EMS is used to flip a bit (or variable node in the Tanner graph representation) with the smallest column weight that is connected to an unsatisfied check node (operation 740). Once the bit has been flipped by the EMS, the decoding flow checks whether the syndrome vector is the all-zero vector (operation 750). If the syndrome is zero, a decoding success is declared (operation 725). If the syndrome is still non-zero (i.e., the correct codeword has not been found), the decoding flow checks whether an index of current iteration has exceeded the maximum number of iterations (operation 760). If the maximum number of iterations has not been reached, the decoding flow continues to the next iteration (operation 710). However, if the maximum number of iterations has been reached, a decoding failure is declared (operation 765).

As described above, to perform the EMS, the number of flipped bits for each iteration is examined. In an iteration, if no bit is flipped and the syndrome vector is non-zero, the EMS will be used to flip a variable node with the smallest column weight connected to an unsatisfied check node and to recalculate the syndrome. Once there is no unsatisfied check node, a decoding success is claimed. Otherwise, the decoder proceeds to the next iteration if the maximum number of iterations has not been exceeded.

Figure 8:
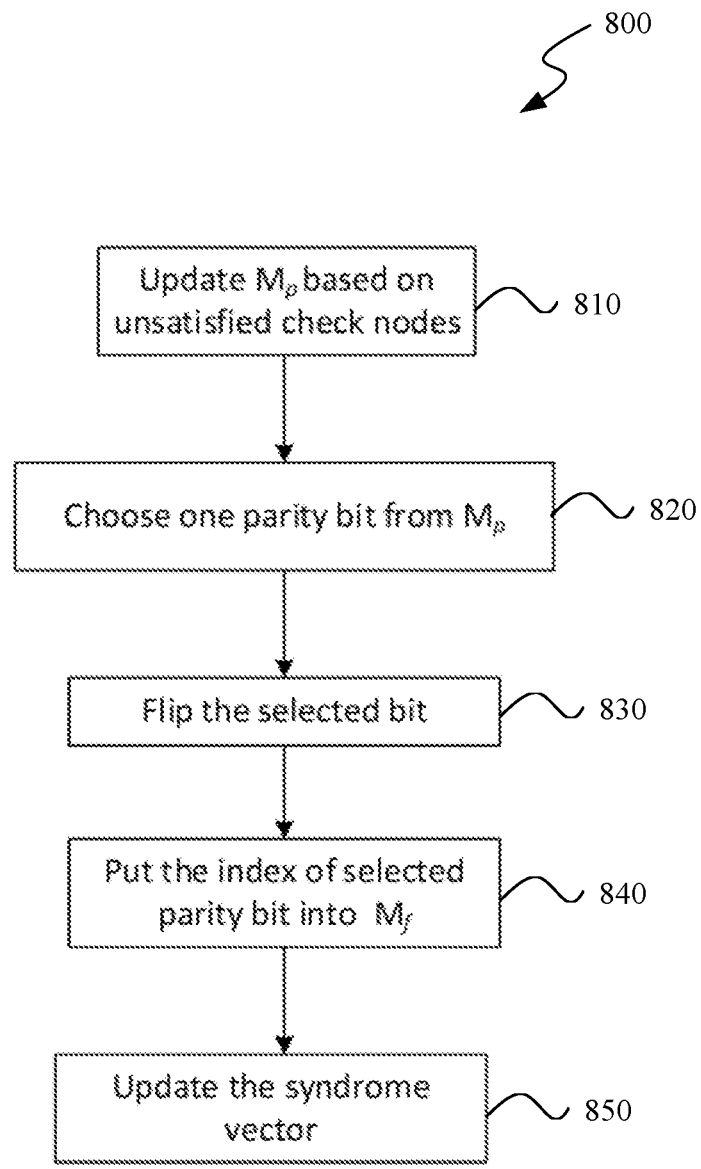
FIG. 8 illustrates an example data flow for an EMS in an irregular LDPC BF decoder.

In some embodiments, a data flow for the EMS in an irregular LDPC bit-flipping decoder may be implemented as illustrated in FIG. 8. In an example, two memory units, $M_p$ and $M_f$ are used to store indexes of variable nodes with the smallest column-weight for flipping candidates and flipped variable nodes by the EMS. The example data flow includes:

Step (1): Find the index of the variable node that has the smallest column weight and is connected to an unsatisfied check node. In an example, there may be multiple variable nodes with the same minimum column weight, in which case, multiple indices are found. If the index is (or indices are) not in $M_p$ and $M_f$, they are stored in $M_p$ (operation 810 in FIG. 8).

Step (2): Choose a variable node from $M_p$ (operation 820), flip its value (operation 830) and recalculate the syndrome vector (operation 850). The index of the chosen variable nodes is then moved to $M_f$ (operation 840).

Step (3): If the recalculated syndrome vector is the all-zero vector, a decoding success is declared. Otherwise, the decoder proceeds to the next iteration (if the iteration index has not exceeded the maximum number of iterations) or declares a decoding failure.

In some embodiments, choosing the variable node in Step (2) (when multiple variable nodes with the smallest column weight are available in Step (1)) may be implemented in any number of ways. In an example, the variable node with the smallest (or minimum) index may be chosen. In another example, the variable node with the largest (or maximum) index may be chosen. In yet another example, the variable node may be randomly selected from the list of available variable nodes with the smallest column weight.

Figure 9:
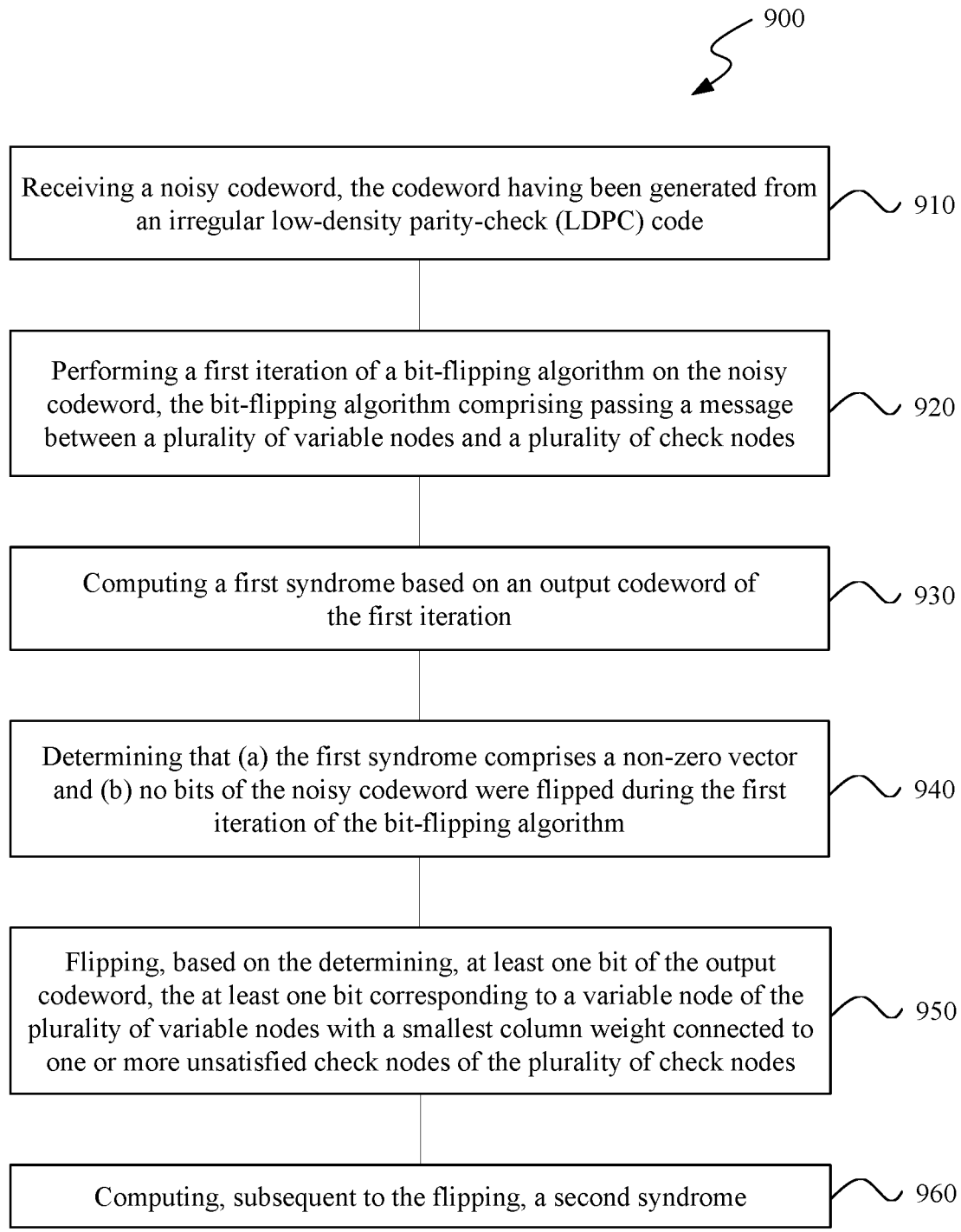
FIG. 9 illustrates a flowchart of an example method for improving a bit-flipping algorithm for irregular LDPC codes.

FIG. 9 illustrates a flowchart of a method 900 for improving a bit-flipping algorithm for an irregular LDPC code in a non-volatile memory device. The method 900 includes, at operation 910, receiving a noisy codeword, the codeword having been generated from an irregular low-density parity-check (LDPC) code.

The method 900 includes, at operation 920, performing a first iteration of a bit-flipping algorithm on the noisy codeword, the bit-flipping algorithm comprising passing a message between a plurality of variable nodes and a plurality of check nodes.

The method 900 includes, at operation 930, computing a first syndrome based on an output codeword of the first iteration.

The method 900 includes, at operation 940, determining that (a) the first syndrome comprises a non-zero vector and (b) no bits of the noisy codeword were flipped during the first iteration of the bit-flipping algorithm.

The method 900 includes, at operation 950, flipping, based on the determining, at least one bit of the output codeword, the at least one bit corresponding to a variable node of the plurality of variable nodes with a smallest column weight connected to one or more unsatisfied check nodes of the plurality of check nodes.

The method 900 includes, at operation 960, computing, subsequent to the flipping, a second syndrome.

In some embodiments, the bit-flipping algorithm is a weighted bit-flipping algorithm, a gradient descent bit-flipping algorithm, or a parallel weighted bit-flipping algorithm.

In some embodiments, the method 900 further includes the operation of performing a subsequent iteration of the bit-flipping algorithm upon a determination that an index if the subsequent iteration is less than a maximum number of iterations.

In some embodiments, the method 900 further includes the operation of selecting, upon a determination that multiple variable nodes of the plurality of variable nodes have the smallest column weight, the variable node from the multiple variable nodes.

In some embodiments, the variable node has a minimum index or a maximum index amongst the multiple variable nodes.

In some embodiments, the variable node is randomly selected from the multiple variable nodes.

In some embodiments, an index of each of the multiple nodes is stored in a first memory, and an indication of the at least one bit of the output codeword that is flipped is stored in a second memory different from the first memory.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving decoding operations of an error correction device, comprising:
receiving a noisy codeword, the codeword having been generated from an irregular low-density parity-check (LDPC) code;
performing a first iteration of a bit-flipping algorithm on the noisy codeword, the bit-flipping algorithm comprising passing a message between a plurality of variable nodes and a plurality of check nodes;
computing a first syndrome based on an output codeword of the first iteration;
determining that (a) the first syndrome comprises a non-zero vector and (b) no bits of the noisy codeword were flipped during the first iteration of the bit-flipping algorithm;
flipping, based on the determining, at least one bit of the output codeword, the at least one bit corresponding to a variable node of the plurality of variable nodes with a smallest column weight connected to one or more unsatisfied check nodes of the plurality of check nodes; and
computing, subsequent to the flipping, a second syndrome.

2. The method of claim 1, wherein the bit-flipping algorithm is a weighted bit-flipping algorithm, a gradient descent bit-flipping algorithm, or a parallel weighted bit-flipping algorithm.

3. The method of claim 1, further comprising:
performing a subsequent iteration of the bit-flipping algorithm upon a determination that an index if the subsequent iteration is less than a maximum number of iterations.

4. The method of claim 1, further comprising:
selecting, upon a determination that multiple variable nodes of the plurality of variable nodes have the smallest column weight, the variable node from the multiple variable nodes.

5. The method of claim 4, wherein the variable node has a minimum index or a maximum index amongst the multiple variable nodes.

6. The method of claim 4, wherein the variable node is randomly selected from the multiple variable nodes.

7. The method of claim 4, wherein an index of each of the multiple nodes is stored in a first memory, and wherein an indication of the at least one bit of the output codeword that is flipped is stored in a second memory different from the first memory.

8. A system for improving decoding operations of an error correction device, comprising:
a processor and a memory including instructions stored thereupon, wherein the instructions upon execution by the processor cause the processor to:
receive a noisy codeword, the codeword having been generated from an irregular low-density parity-check (LDPC) code;
perform a first iteration of a bit-flipping algorithm on the noisy codeword, the bit-flipping algorithm comprising passing a message between a plurality of variable nodes and a plurality of check nodes;
compute a first syndrome based on an output codeword of the first iteration;
determine that (a) the first syndrome comprises a non-zero vector and (b) no bits of the noisy codeword were flipped during the first iteration of the bit-flipping algorithm;
flip, based on the determining, at least one bit of the output codeword, the at least one bit corresponding to a variable node of the plurality of variable nodes with a smallest column weight connected to one or more unsatisfied check nodes of the plurality of check nodes; and compute, subsequent to the flipping, a second syndrome.

9. The system of claim 8, wherein the bit-flipping algorithm is a weighted bit-flipping algorithm, a gradient descent bit-flipping algorithm, or a parallel weighted bit-flipping algorithm.

10. The system of claim 8, wherein the instructions upon execution by the processor further cause the processor to:
perform a subsequent iteration of the bit-flipping algorithm upon a determination that an index if the subsequent iteration is less than a maximum number of iterations.

11. The system of claim 8, wherein the instructions upon execution by the processor further cause the processor to:
select, upon a determination that multiple variable nodes of the plurality of variable nodes have the smallest column weight, the variable node from the multiple variable nodes.

12. The system of claim 11, wherein the variable node has a minimum index or a maximum index amongst the multiple variable nodes.

13. The system of claim 11, wherein the variable node is randomly selected from the multiple variable nodes.

14. The system of claim 11, wherein an index of each of the multiple nodes is stored in a first memory, and wherein an indication of the at least one bit of the output codeword that is flipped is stored in a second memory different from the first memory.

15. A non-transitory computer-readable storage medium having instructions stored thereupon for improving decoding operations of an error correction device, comprising:
instructions for receiving a noisy codeword, the codeword having been generated from an irregular low-density parity-check (LDPC) code;
instructions for performing a first iteration of a bit-flipping algorithm on the noisy codeword, the bit-flipping algorithm comprising passing a message between a plurality of variable nodes and a plurality of check nodes;
instructions for computing a first syndrome based on an output codeword of the first iteration;
instructions for determining that (a) the first syndrome comprises a non-zero vector and (b) no bits of the noisy codeword were flipped during the first iteration of the bit-flipping algorithm;
instructions for flipping, based on the determining, at least one bit of the output codeword, the at least one bit corresponding to a variable node of the plurality of variable nodes with a smallest column weight connected to one or more unsatisfied check nodes of the plurality of check nodes; and
instructions for computing, subsequent to the flipping, a second syndrome.

16. The storage medium of claim 15, wherein the bit-flipping algorithm is a weighted bit-flipping algorithm, a gradient descent bit-flipping algorithm, or a parallel weighted bit-flipping algorithm.

17. The storage medium of claim 15, further comprising:
instructions for selecting, upon a determination that multiple variable nodes of the plurality of variable nodes have the smallest column weight, the variable node from the multiple variable nodes.

18. The storage medium of claim 17, wherein the variable node has a minimum index or a maximum index amongst the multiple variable nodes.

19. The storage medium of claim 17, wherein the variable node is randomly selected from the multiple variable nodes.

20. The storage medium of claim 17, wherein an index of each of the multiple nodes is stored in a first memory, and wherein an indication of the at least one bit of the output codeword that is flipped is stored in a second memory different from the first memory.

* * * * *